United States Patent
Hino (10) Patent No.: US 9,019,034 B2
(45) Date of Patent: Apr. 28, 2015

(54) NON-RECIPROCAL CIRCUIT ELEMENT

(71) Applicant: Murata Manufacturing Co., Ltd., Nagaokakyo-shi, Kyoto-fu (JP)

(72) Inventor: Seigo Hino, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/542,916

(22) Filed: Nov. 17, 2014

(65) Prior Publication Data

US 2015/0070103 A1    Mar. 12, 2015

Related U.S. Application Data

(63) Continuation of application No. PCT/JP2013/061375, filed on Apr. 17, 2013.

(30) Foreign Application Priority Data

May 28, 2012  (JP) ................................ 2012-120355

(51) Int. Cl.
*H01P 1/36* (2006.01)
*H03H 7/38* (2006.01)
*H01P 1/365* (2006.01)

(52) U.S. Cl.
CPC .. *H01P 1/36* (2013.01); *H03H 7/38* (2013.01); *H01P 1/365* (2013.01)

(58) Field of Classification Search
CPC ............. H01P 1/36; H01P 1/32; H01P 1/365; H01P 1/383
USPC ................................. 333/1.1, 24.2
See application file for complete search history.

(56) References Cited

U.S. PATENT DOCUMENTS

| 7,626,471 B2 | 12/2009 | Kishimoto et al. |
| 2002/0021181 A1 | 2/2002 | Hasegawa |
| 2008/0218288 A1 | 9/2008 | Hino |
| 2011/0204989 A1 | 8/2011 | Wada |

FOREIGN PATENT DOCUMENTS

| JP | 2001-332908 A | 11/2001 |
| JP | 2006-033482 A | 2/2006 |
| JP | 2011-176668 A | 9/2011 |
| WO | 2007/049789 A1 | 5/2007 |
| WO | 2008/087782 A1 | 7/2008 |

OTHER PUBLICATIONS

Official Communication issued in International Patent Application No. PCT/JP2013/061375, mailed on Jul. 30, 2013.

*Primary Examiner* — Stephen E Jones
(74) *Attorney, Agent, or Firm* — Keating & Bennett, LLP (57) ABSTRACT

A non-reciprocal circuit element includes a permanent magnet, a microwave magnetic body to which a direct current magnetic field is applied by the permanent magnet, a first center electrode that is wrapped around the microwave magnetic body, is connected at one end to an input port, and is connected at another end to an output port, a second center electrode that is wrapped around the microwave magnetic body while intersecting with the first center electrode so as to be insulated from the first center electrode, is connected at one end to the output port, and is connected at another end to a ground port, a first matching capacitance connected between the input port and the output port in parallel with the first center electrode, a terminating resistance connected between the input port and the output port in parallel with the first center electrode, and a second matching capacitance connected between the output port and the ground port. A sub-center electrode is connected in parallel to a portion of the second center electrode.

18 Claims, 6 Drawing Sheets

NON-RECIPROCAL CIRCUIT ELEMENT

BACKGROUND OF THE INVENTION

1. Field of the Invention

The present invention relates to non-reciprocal circuit elements, and particularly relates to non-reciprocal circuit elements such as isolators, circulators, and the like, preferably for use in microwave bands, for example.

2. Description of the Related Art

Non-reciprocal circuit elements such as isolators, circulators, and the like have conventionally had characteristics in which signals are transmitted only in a predetermined specific direction, and are not transmitted in the reverse direction. Using such characteristics, an isolator, for example, is used as a sending circuit portion in a mobile communication device such as a cellular phone or the like.

As this type of non-reciprocal circuit element, WO 2008/087782 discloses a two-port isolator configured of a permanent magnet, a ferrite to which a direct current magnetic field is applied by the permanent magnet, a first center electrode and a second center electrode disposed so as to intersect around the ferrite and be electrically insulated from each other, and so on.

According to this isolator, in the case where the first and second center electrodes are designed so as to have a desired inductance value, the number of times the first and second center electrodes are wrapped around the ferrite, the width of the lines, the shape (depth) of through-holes used for connections, and the thickness of the ferrite serve as parameters. However, reducing the size of the isolator also makes it necessary to reduce the size of the ferrite, which in turn reduces the freedom with which the various parameters can be set, making it difficult to achieve a desired inductance.

Inductance of the center electrodes can be reduced by reducing the number of times the electrodes are wrapped, increasing the line width, increasing the depth of the through holes, and reducing the thickness of the ferrite. However, reducing the number of times the electrodes are wrapped will cause a drastic drop in the inductance. In other words, inductance is proportional to the square of the number of times the electrodes are wrapped, and thus if three turns are reduced to two terms, for example, the inductance will drop by approximately 55%. The coupling of the first and second center electrodes will also drop, causing a degradation in the insertion loss characteristics.

Meanwhile, increasing the line width of the center electrodes or increasing the depth of the through holes results in an increased chance of shorts between the electrodes, which is problematic in terms of reliability. Furthermore, reducing the thickness of the ferrite is problematic because doing so also reduces the strength of the ferrite, which in turn increases the chance of breaks, cracks, and so on being produced in a ferrite substrate during a polishing process, a process for forming the center electrodes, and so on.

In recent years, the operational frequencies of non-reciprocal circuit elements are moving toward high-frequency bands, of 2 GHz or greater. In such a case, the optimal inductance for the center electrodes is low, and thus the aforementioned problems appear prominently. Furthermore, inter-line stray capacitance is generated unavoidably between the center electrodes, resulting in the center electrodes self-resonating at a constant frequency, and thus a non-reciprocal circuit element that operates at a frequency band greater than or equal to the self-resonating frequency cannot be realized. As such, it is necessary to reduce the inductance of the center electrodes and increase the self-resonating frequency in order to realize a non-reciprocal circuit element having a high operational frequency.

SUMMARY OF THE INVENTION

Accordingly, preferred embodiments of the present invention provide a non-reciprocal circuit element configured to operate in a high-frequency band by reducing the inductance of a second center electrode without negatively affecting the rest of the element.

A non-reciprocal circuit element according to an aspect of various preferred embodiments of the present invention includes a permanent magnet, a microwave magnetic body to which a direct current magnetic field is configured to be applied by the permanent magnet, a first center electrode that is wrapped around the microwave magnetic body, is connected at one end to an input port, and is connected at another end to an output port, a second center electrode that is wrapped around the microwave magnetic body while intersecting with the first center electrode so as to be insulated from the first center electrode, is connected at one end to the output port, and is connected at another end to a ground port, a first matching capacitance connected between the input port and the output port in parallel with the first center electrode, a terminating resistance connected between the input port and the output port in parallel with the first center electrode, and a second matching capacitance connected between the output port and the ground port; a sub-center electrode is connected in parallel to a portion of the second center electrode.

In the non-reciprocal circuit element, the sub-center electrode is connected in parallel to a portion of the second center electrode, and thus the combined inductance of the second center electrode is reduced. In other words, by setting the inductance of the sub-center electrode to an appropriate value, the inductance of the second center electrode is capable of being adjusted by fine amounts, which makes it possible to avoid drastic drops in the inductance as when reducing the number of times the electrodes are wrapped and obtaining a desired inductance as a result. This avoids a drop in the coupling between the first and second center electrodes, which in turn prevents the insertion loss characteristics from degrading. In addition, it is not necessary to increase the line width of the second center electrode, to increase the depth of the through-holes, or to make the ferrite thinner, which makes it possible to avoid the risk of shorts between the electrodes and avoid breaks, cracks and so on from being produced in the ferrite substrate.

According to various preferred embodiments of the present invention, the inductance of the second center electrode is significantly reduced without negatively affecting the rest of the element, which makes it possible to operate in a high-frequency band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of non-reciprocal circuit elements according to the present invention will be described below with reference to the accompanying drawings. Note that members and portions that are the same in the drawings will be given the same reference numerals, and redundant descriptions thereof will be omitted.

First Preferred Embodiment

Figure 1:
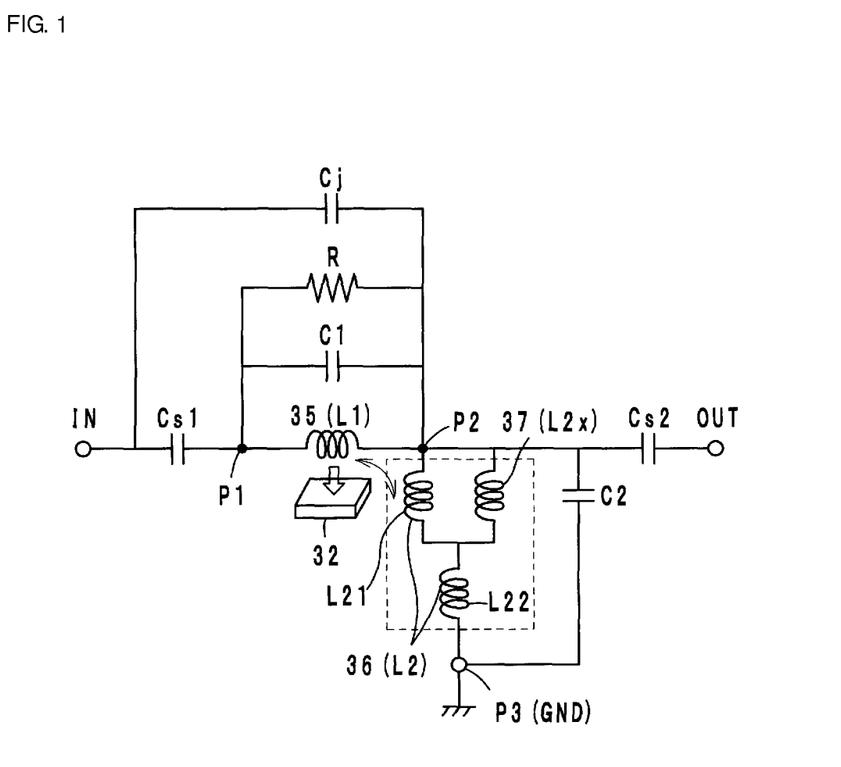
FIG. 1 is an equivalent circuit diagram illustrating a non-reciprocal circuit element (a two-port isolator) according to a first preferred embodiment of the present invention.

A two-port isolator according to a first preferred embodiment is preferably configured as an equivalent circuit illustrated in FIG. 1. That is, the isolator includes a microwave magnetic body (called a ferrite 32 hereinafter) to which a direct current magnetic field is applied by a permanent magnet not shown here, and a first center electrode 35 (an inductance L1) and a second center electrode 36 (an inductance L2) disposed so as to intersect around the ferrite 32 and be electrically insulated from each other. The first center electrode 35 is connected at one end to an input port P1 and at the other end to an output port P2. The second center electrode is connected at one end to the output port P2 and at the other end to a ground port P3. A terminating resistance R is connected between the input port P1 and the output port P2 in parallel with the first center electrode 35, a matching capacitor C1 is connected between the input port P1 and the output port P2, and a matching capacitor C2 is connected between the output port P2 and the ground port P3.

Furthermore, a coupling capacitor Cj is connected between an input terminal IN and the output port P2, a capacitor Cs1 configured to provide input impedance matching is connected between the input terminal IN and the input port P1, and a capacitor Cs2 configured to provide output impedance matching is connected between an output terminal OUT and the output port P2.

A sub-center electrode 37 is connected in parallel to a portion of the second center electrode 36. In other words, the second center electrode 36 includes an inductance L2x of the sub-center electrode 37, an inductance L21 provided in parallel with the inductance L2x, and an inductance L22 provided in series with the inductances L21 and L2x.

In a concentrated-constant isolator configured as the equivalent circuit described above, when a high-frequency current is inputted into the input terminal IN (forward direction input), a large current flows in the second center electrode 36 and is transmitted to the output terminal OUT. The transmission frequency is determined by a parallel resonating circuit formed by the inductance L2 in the second center electrode 36 and the capacitor C2. At this time, almost no high-frequency current flows in the terminating resistance R, the capacitor C1, and so on, and thus there is low insertion loss. Furthermore, during forward-direction transmission, due to the effects of magnetic coupling between the center electrode 35 and 36, the transmitted signal and a signal transmitted via the capacitor Cj strengthen each other, resulting in a greater transmitted signal. On the other hand, when a high-frequency current is inputted into the output terminal OUT (reverse direction input), the signal is attenuated (isolation) by the parallel resonating circuit, defined by the inductance L1 of the first center electrode 35 and the capacitor C1, and the terminating resistance R.

Figure 2:
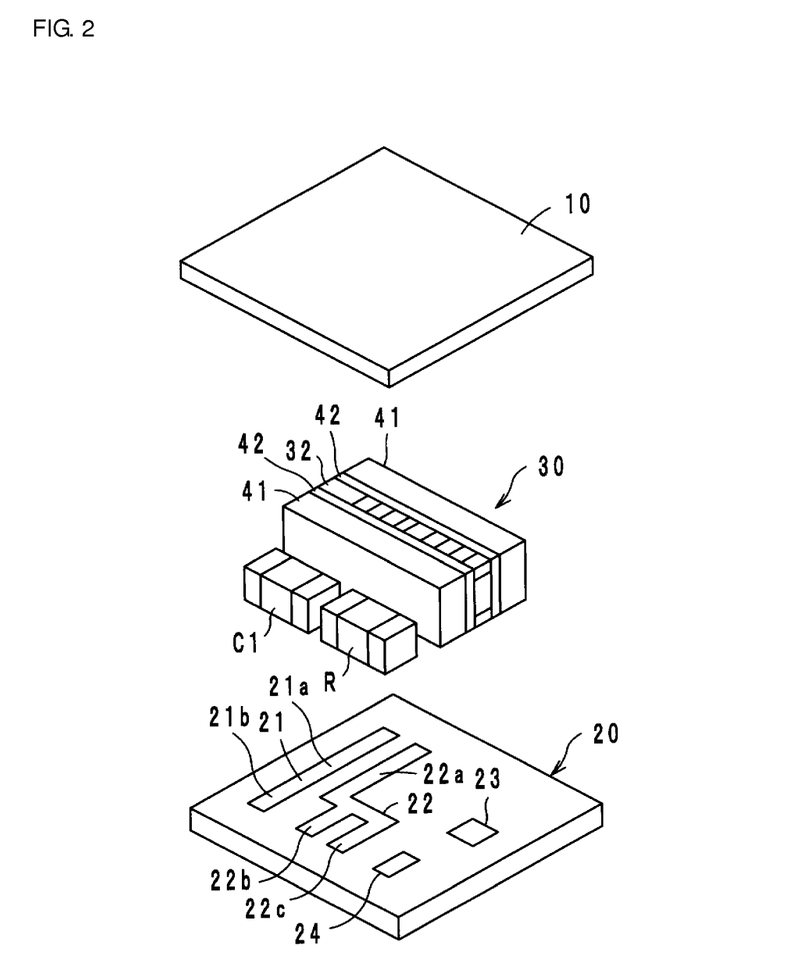
FIG. 2 is an exploded perspective view illustrating the non-reciprocal circuit element of FIG. 1.

Specifically, this two-port isolator is generally configured of a circuit board 20, a ferrite-magnet element 30 including the ferrite 32 and a pair of permanent magnets 41, and a yoke 10, as shown in FIG. 2.

Figure 3:
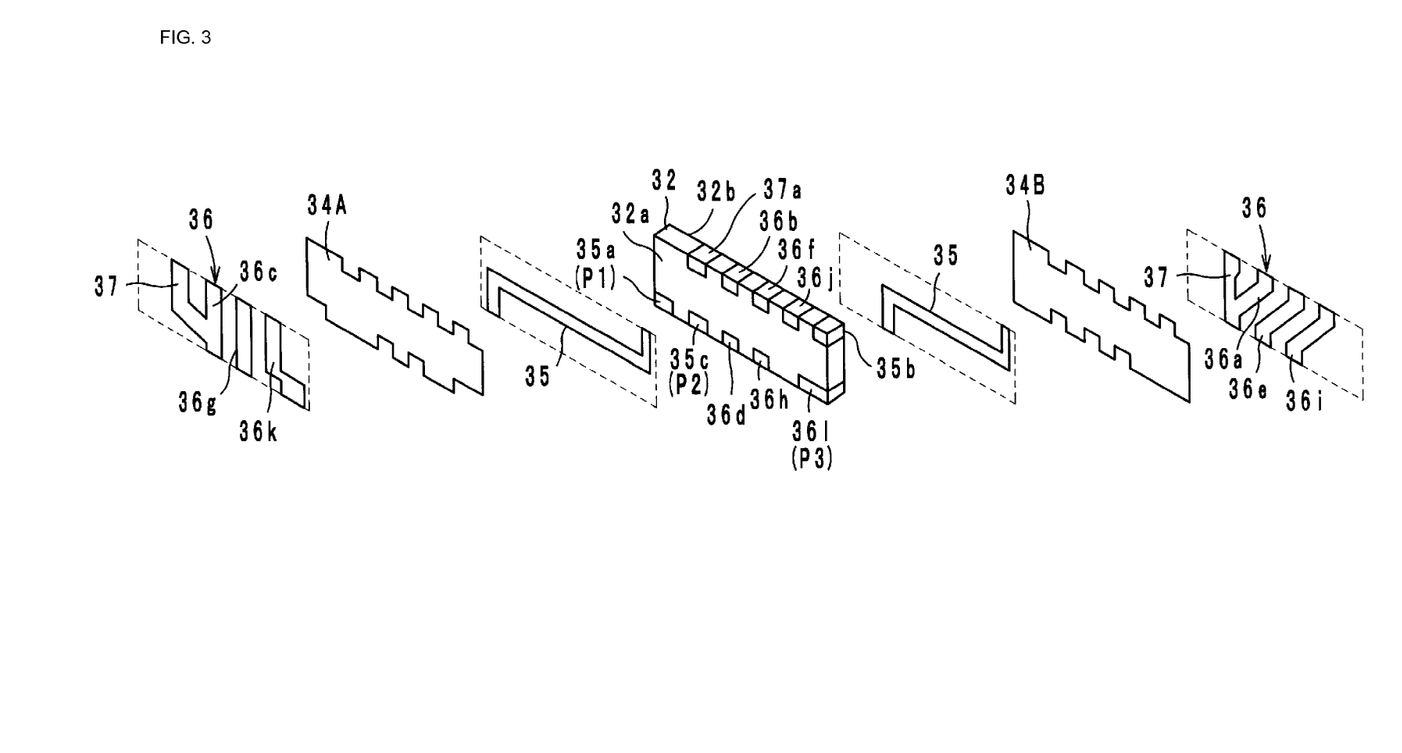
FIG. 3 is an exploded perspective view illustrating a ferrite having center electrodes configuring the non-reciprocal element of FIG. 1.

As shown in FIG. 3, the first center electrode 35 and the second center electrode 36 are provided on front and rear main surfaces 32a and 32b of the ferrite 32 so as to be electrically insulated from each other by insulating members 34A and 34B. The ferrite 32 preferably has a rectangular or substantially rectangular parallelepiped shape in which the first main surface 32a and the second main surface 32b are parallel or substantially parallel to each other.

Meanwhile, the ferrite-magnet element 30 is formed preferably by affixing the permanent magnets 41 using an epoxy-based adhesive 42 (see FIG. 2), for example, so that the permanent magnets 41 oppose the main surfaces 32a and 32b and a magnetic field is applied to the ferrite 32 in a direction perpendicular or substantially perpendicular to the main surfaces 32a and 32b. Main surfaces of the permanent magnets 41 have the same dimensions as the main surfaces 32a and 32b of the ferrite 32, and the constituent elements are disposed so that the outer shapes of the respective main surfaces match.

The first center electrode 35 preferably is defined by a conductive film. In other words, as shown in FIG. 3, the first center electrode 35 is arranged so as to be connected to a connection electrode 35a located on a bottom surface of the ferrite 32, rising from a lower-left area of the first main surface 32a and extending almost horizontally, rising again on an upper-right area, and then wrapping around to the second main surface 32b via a relay electrode 35b on a top surface. On the second main surface 32b, the first center electrode 35 is arranged so as to almost overlap when viewed from the first main surface 32a, and one end portion thereof is connected to a connection electrode 35c located on the bottom surface. In this manner, the first center electrode 35 is wrapped around the ferrite 32 in one turn. The first center electrode 35, the second center electrode 36, and the sub-center electrode 37 are arranged with the insulating members 34A and 34B therebetween, and thus intersect while being insulated from each other. The angle of intersect between the center electrodes 35 and 36 is set as required, which adjusts the input impedance, the insertion loss, and so on.

The second center electrode 36 is preferably defined by a conductive film. With respect to the second center electrode 36, first, an electrode 36a corresponding to a 0.5th turn is connected to the connection electrode 35c located on the bottom surface of the ferrite 32, rises on the second main surface 32b side while intersecting with the first center electrode 35 at an angle, and wraps around to the first main surface 32a via a relay electrode 36b on the top surface, where an electrode 36c corresponding to a first turn is arranged on the first main surface 32a side so as to intersect with the first center electrode 35. A lower end portion of the electrode 36c corresponding to the first turn wraps around to the second main surface 32b side via a relay electrode 36d, and an electrode 36e corresponding to a 1.5th turn rises on the second main surface 32b side and wraps around to the first main surface 32a side via a relay electrode 36f on the top surface. In the same manner, an electrode 36g corresponding to a second turn, a relay electrode 36h, an electrode 36i corresponding to a 2.5th turn, a relay electrode 36j, and an electrode 36k corresponding to a third turn are arranged along the surfaces of the ferrite 32. A lower end portion of the electrode 36k corresponding to the third turn is connected to a connection electrode 36l located on the bottom surface of the ferrite 32.

The sub-center electrode 37 branches upward from a lower portion of the electrode 36a corresponding to the 0.5th turn, wraps around to the first main surface 32a side via a connection electrode 37a located on the top surface of the ferrite, and is connected to a lower portion of the electrode 36c corresponding to the first turn. In other words, the sub-center electrode 37 is connected in parallel to an end wrapped portion of the second center electrode 36, and is wrapped around the ferrite 32 for slightly less than one turn.

The connection electrodes 35a, 35c, and 36l, the relay electrodes 35b, 36b, 36d, 36f, 36h, 36j, and 37a, and so on are formed preferably by the application or filling of an electrode conductor in recesses located in the top and bottom surfaces of the ferrite 32. Such electrodes are formed preferably by forming through-holes in a mother ferrite substrate in advance, filling the through-holes with a conductive material for electrodes, and then cutting the mother ferrite substrate at locations that divide the through-holes. Note that the various electrodes may be provided as conductive films in the through-holes. When manufacturing using a method that enables multiple pieces to be obtained, the cutting may be carried out with the permanent magnets stacked on the mother ferrite substrate using the adhesive.

The circuit board 20 is a multilayer board in which predetermined internal electrodes, via hole conductors used for interlayer connections, and so on are provided on a plurality of dielectric sheets, which are then stacked and fired. The matching capacitors C2, Cs1, Cs2, and Cj shown in FIG. 1 are provided within the circuit board 20. Various wiring conductors 21, 22, 23, and 24 are provided on a top surface of the circuit board 20. The input port P1 (the electrode 35a) is connected to a portion 21a of the wiring conductor 21, the output port P2 (the electrode 35c) is connected to a portion 22a of the wiring conductor 22, and the ground port P3 (the electrode 36l) is connected to the wiring conductor 23. The matching capacitor C1 is connected to ends 21b and 22b of the wiring conductors 21 and 22, and the terminating resistance R is connected between one end 22c of the wiring conductor 22 and the wiring conductor 24.

The wiring conductors 21, 22, 23, and 24 are connected so that the equivalent circuit illustrated in FIG. 1 is configured in the circuit board 20. Furthermore, the input terminal IN, the output terminal OUT, and a ground terminal GND are provided on a bottom surface of the circuit board 20.

In the stated isolator, the sub-center electrode 37 (L2x) is connected in parallel to a portion (L21) of the second center electrode 36, and thus the combined inductance (L2) of the second center electrode 36 is low. In other words, by setting the sub-center electrode 37 to any desired line width and length and then setting the inductance (L2x) thereof to an appropriate value, the inductance (L2) of the second center electrode 36 is capable of being adjusted by fine amounts. In the second center electrode 36, the inductance L21 is provided by the electrodes 36a and 36c, and the inductance L22 is provided by the electrodes 36e, 36g, 36i, and 36k. In this case, the combined inductance L2 is expressed by the following formula:

$$L2=(L21 \cdot L2x)/(L21+L2x)+L22.$$

Figure 5:
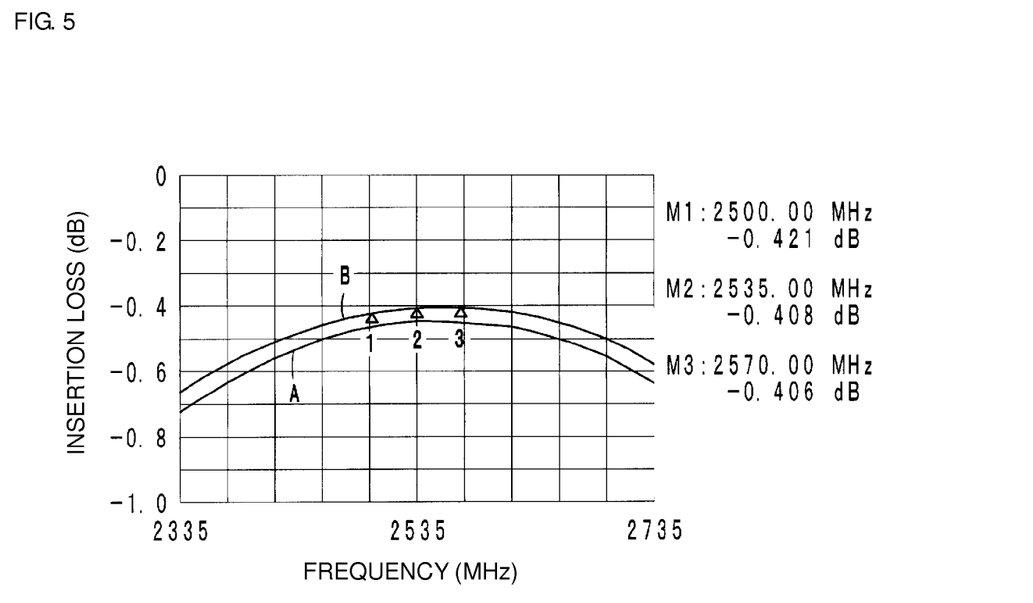
FIG. 5 is a graph illustrating insertion loss characteristics of the non-reciprocal circuit elements according to the first preferred embodiment and the second preferred embodiment of the present invention.

The number of times the second center electrode 36 is wrapped is not reduced, and thus the inductance L2 of the second center electrode 36 does not drop drastically, and furthermore, the coupling of the first and second center electrodes 35 and 36 does not drop. In other words, the insertion loss characteristics experience almost no degradation even if the sub-center electrode 37 is added to the second center electrode 36. The insertion loss characteristics according to the present first preferred embodiment are indicated in FIG. 5 by a curve A. In this case, the inductance L21 is preferably set to about 1.0 nH, the inductance L2x is preferably set to about 0.8 nH, and the inductance L22 is preferably set to about 3.0 nH, for example. The combined inductance L2 preferably is about 3.4 nH, for example. Meanwhile, the self-resonating frequency preferably is about 3.3 GHz, for example. Although the non-reciprocal circuit element cannot be operated above the self-resonating frequency, the present first preferred embodiment increases the self-resonating frequency to about 3.3 GHz by reducing the inductance L2 of the second center electrode 36, making it possible to operate in a high-frequency band.

The inductance L2x of the sub-center electrode 37 may be greater than, less than, or equal to the inductance L21 in the parallel portion of the second center electrode 36. In the present first preferred embodiment, the inductance L2x is set to be slightly lower than the inductance L21.

Meanwhile, the line width of the second center electrode 36 is not increased, and thus there is no increased risk of shorts between the electrodes in the second center electrode 36. Furthermore, because the depth of the through-holes (the thickness of the connection electrodes) is not increased, there is no increased risk of shorts between the connection electrodes and the first center electrode 35. In addition, it is not necessary to make the ferrite 32 thinner, which makes it possible to avoid breaks, cracks and so on from being produced in the ferrite substrate.

Furthermore, the sub-center electrode 37 can be formed at the same time as the second center electrode 36 through a method such as photolithography, screen printing, or the like, making an additional process for forming the sub-center electrode 37 unnecessary and thus avoiding incurring increased costs. In the present first preferred embodiment, the sub-center electrode 37 is preferably provided in the end wrapped portion of the second center electrode 36, which is originally dead space, and it is thus not necessary to increase the size of the ferrite 32. Note that the sub-center electrode 37 may be configured so as to be connected to the electrodes 36i and 36k in parallel. Alternatively, the sub-center electrode 37 may be configured so as to be connected to the electrodes 36e and 36g, which are disposed intermediately, in parallel.

Second Preferred Embodiment

Figure 4:
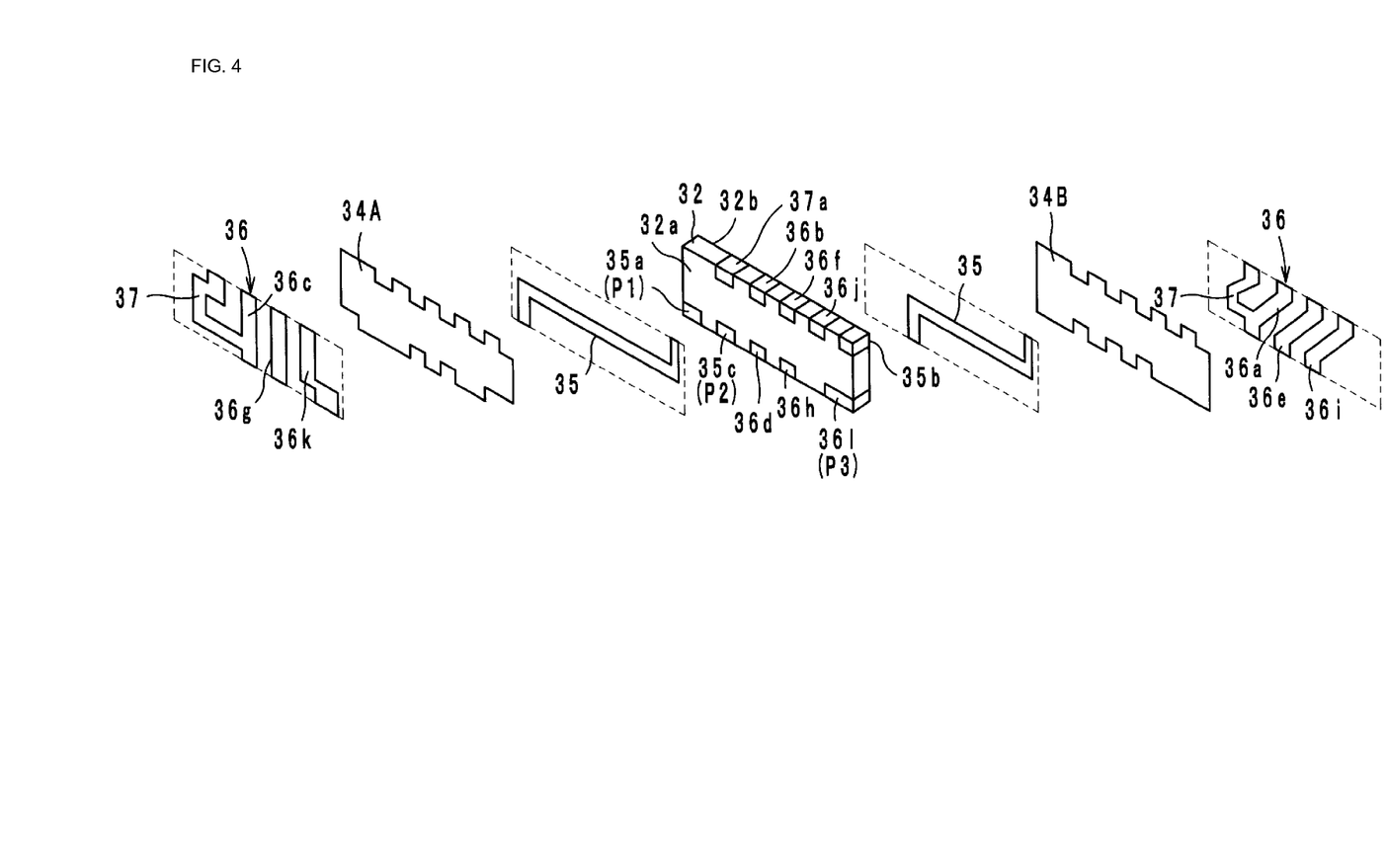
FIG. 4 is an exploded perspective view illustrating a ferrite including center electrodes configuring a non-reciprocal circuit element (two-port isolator) according to a second preferred embodiment of the present invention.

In a two-port isolator according to the second preferred embodiment of the present invention, a path length of the sub-center electrode 37 connected to the electrodes 36a and 36c of the second center electrode 36 in parallel is preferably slightly longer than that in the sub-center electrode 37 according to the first preferred embodiment, as shown in FIG. 4. Other configurations are preferably the same or substantially the same as in the first preferred embodiment.

In the present second preferred embodiment, increasing the path length of the sub-center electrode 37 sets the inductance L2x of the sub-center electrode 37 to be slightly higher than the inductance L21 of the parallel portion of the second center electrode 36. Specifically, the inductance L21 is preferably set to about 1.0 nH, the inductance L2x is preferably set to about 2.0 nH, and the inductance L22 is preferably set to about 3.0 nH, for example. The combined inductance L2 preferably is about 3.7 nH, for example. Meanwhile, the self-resonating frequency preferably is about 2.8 GHz, for example. The insertion loss characteristics according to the present second preferred embodiment are indicated in FIG. 5 by a curve B. The inductance L21 of the second center electrode 36, which contributes to the coupling with the first center electrode 35, is lower than the inductance L2x of the sub-center electrode 37, which does not contribute to the coupling with the first center electrode 35, and thus the insertion loss characteristics are prevented from degrading, and the characteristic curve B shows more favorable effects than the characteristic curve A according to the first preferred embodiment. Other actions and effects of the second preferred embodiment are preferably the same as in the first preferred embodiment.

Third Preferred Embodiment

Figure 6:
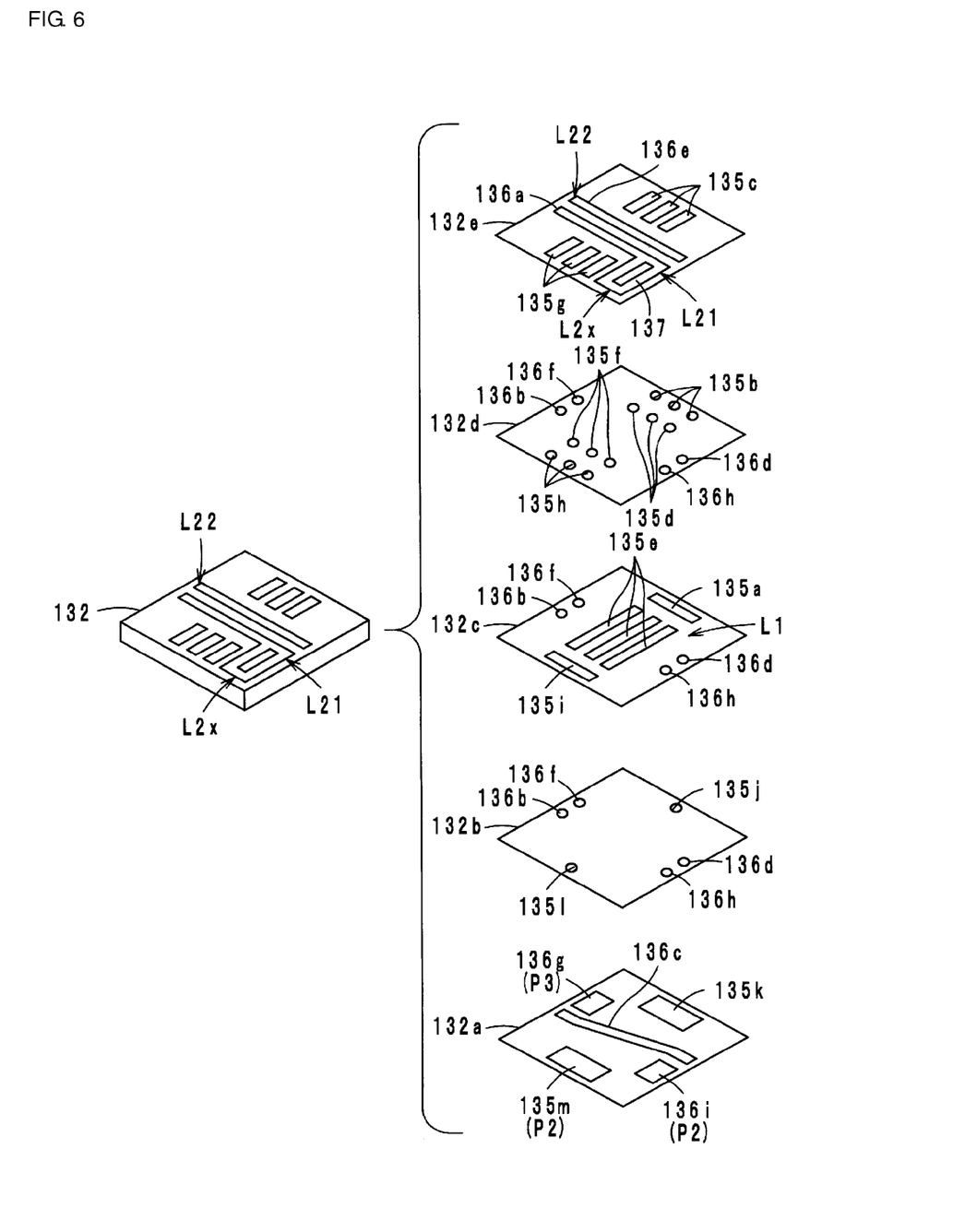
FIG. 6 is a perspective view illustrating the primary components of a non-reciprocal circuit element (a two-port isolator) according to a third preferred embodiment of the present invention.

In a two-port isolator according to the third preferred embodiment of the present invention, a ferrite 132 is configured of a multilayer body obtained by stacking sheets 132a to 132e in order and firing the sheets, and first and second center electrodes 135 and 136, as well as a sub-center electrode 137, are provided on front and rear surfaces and within the ferrite 132, as indicated in FIG. 6.

Specifically, the first center electrode 135 is formed preferably by connecting an electrode 135a to one end of an electrode 135c through a via hole conductor 135b, connecting the other end of the electrode 135c to one end of an electrode 135e through a via hole conductor 135d, connecting the other end of the electrode 135e to one end of an electrode 135g through a via hole conductor 135f, and connecting the other end of the electrode 135g to an electrode 135i through a via hole conductor 135h. The electrode 135a is connected to an electrode 135k (the input port P1) through a via hole conductor 135j. The electrode 135i is connected to an electrode 135m (the output port P2) through a via hole conductor 135l.

The second center electrode 136 is formed preferably by connecting one end of an electrode 136a to one end of an electrode 136c through a via hole conductor 136b, and connecting the other end of the electrode 136c to one end of an electrode 136e through a via hole conductor 136d. The other end of the electrode 136e is connected to an electrode 136g (the ground port P3) through a via hole conductor 136f. The other end of the electrode 136a is connected to an electrode 136i (the output port P2) through a via hole conductor 136h. The sub-center electrode 137 is preferably configured so as to create a loop to the other end portion of the electrode 136a.

An equivalent circuit according to the present third preferred embodiment is as indicated in FIG. 1, and other configurations are preferably the same as in the first preferred embodiment. The sub-center electrode 137 is connected in parallel to a portion of the second center electrode 136. Other actions and effects of the third preferred embodiment are basically the same as in the first preferred embodiment.

Other Preferred Embodiments

Note that the non-reciprocal circuit element according to the present invention is not intended to be limited to the aforementioned preferred embodiments, and many variations can be made thereto without departing from the essential scope of the present invention.

For example, the input port and the output port can be switched if the N and S poles of the permanent magnet are inverted. Furthermore, the configurations, shapes, numbers of turns, and so on of the first center electrode, the second center electrode, and the sub-center electrode can be set as desired. Alternatively, the matching capacitors provided within the circuit board 20 in the aforementioned preferred embodiments may be mounted upon the circuit board 20 as chip-type capacitors.

Preferred embodiments of the present invention are useful in non-reciprocal circuit elements and particularly useful in that the preferred embodiments enable operation in high-frequency bands by reducing the inductance of the second center electrode without negatively affecting the rest of the element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A non-reciprocal circuit element comprising:
a permanent magnet;
a microwave magnetic body to which a direct current magnetic field is applied by the permanent magnet;
a first center electrode that is wrapped around the microwave magnetic body, is connected at one end to an input port, and is connected at another end to an output port;
a second center electrode that is wrapped around the microwave magnetic body and intersecting with the first center electrode so as to be insulated from the first center electrode, is connected at one end to the output port, and is connected at another end to a ground port;
a first matching capacitance connected between the input port and the output port in parallel with the first center electrode;
a terminating resistance connected between the input port and the output port in parallel with the first center electrode; and
a second matching capacitance connected between the output port and the ground port; wherein
a sub-center electrode is connected in parallel to a portion of the second center electrode.

2. The non-reciprocal circuit element according to claim 1, wherein an inductance of the sub-center electrode is greater than an inductance of a parallel portion of the second center electrode.

3. The non-reciprocal circuit element according to claim 1, wherein an inductance of the sub-center electrode is less than or equal to an inductance of a parallel portion of the second center electrode.

4. The non-reciprocal circuit element according to claim 1, wherein the second center electrode is wrapped around the microwave magnetic body a plurality of times, and the sub-center electrode is connected to an end wrapped portion of the second center electrode.

5. The non-reciprocal circuit element according to claim 1, wherein the non-reciprocal circuit element is an isolator.

6. The non-reciprocal circuit element according to claim 1, wherein the non-reciprocal circuit element is a two-port isolator.

7. The non-reciprocal circuit element according to claim 1, further comprising a coupling capacitor connected between an input terminal and the output port.

8. The non-reciprocal circuit element according to claim 1, further comprising a capacitor configured to perform input impedance matching and connected between an input terminal and the input port.

9. The non-reciprocal circuit element according to claim 1, further comprising a capacitor configured to perform output impedance matching and connected between an output terminal and the output port.

10. The non-reciprocal circuit element according to claim 1, wherein each of the first center electrode and the second center electrode is defined by a conductive film.

11. The non-reciprocal circuit element according to claim 1, wherein the first center electrode is wrapped around the microwave magnetic body in one turn.

12. The non-reciprocal circuit element according to claim 1, wherein the sub-center electrode is connected in parallel to an end wrapped portion of the second center electrode, and is wrapped around the microwave magnetic body in less than one turn.

13. The non-reciprocal circuit element according to claim 1, wherein a path length of the sub-center electrode is configured such that an inductance of the sub-center electrode is higher than an inductance of the parallel portion of the second center electrode.

14. The non-reciprocal circuit element according to claim 1, wherein the first center electrode includes at least a pair of electrodes connected by a via hole conductor.

15. The non-reciprocal circuit element according to claim 1, wherein the second center electrode includes at least a pair of electrodes connected by a via hole conductor.

16. The non-reciprocal circuit element according to claim 1, further comprising a circuit board including matching capacitors.

17. The non-reciprocal circuit element according to claim 16, wherein the matching capacitors are provided within the circuit board.

18. The non-reciprocal circuit element according to claim 16, wherein the matching capacitors are defined by chip capacitors provided on the circuit board.

* * * * *